US008995200B1

(12) United States Patent
Mu et al.

(10) Patent No.: US 8,995,200 B1
(45) Date of Patent: Mar. 31, 2015

(54) NON-VOLATILE MEMORY (NVM) WITH DYNAMICALLY ADJUSTED REFERENCE CURRENT

(71) Applicants: Fuchen Mu, Austin, TX (US); Chen He, Austin, TX (US); Yanzhuo Wang, Austin, TX (US)

(72) Inventors: Fuchen Mu, Austin, TX (US); Chen He, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/033,622

(22) Filed: Sep. 23, 2013

(51) Int. Cl.
  *G11C 16/06* (2006.01)
  *G11C 7/08* (2006.01)
(52) U.S. Cl.
  CPC .......................................... *G11C 7/08* (2013.01)
  USPC ............... 365/185.21; 365/185.2; 365/185.22
(58) Field of Classification Search
  USPC .................................................... 365/185.21
  See application file for complete search history.

(56) References Cited

U.S. PATENT DOCUMENTS

| | | | | |
|---|---|---|---|---|
| 5,600,593 A | * | 2/1997 | Fong | ......................... 365/185.19 |
| 5,822,250 A | | 10/1998 | Krzentz | |
| 5,880,996 A | * | 3/1999 | Roohparvar | ............. 365/185.33 |
| 6,826,103 B2 | | 11/2004 | Moon et al. | |
| 7,564,716 B2 | * | 7/2009 | Syzdek et al. | ............. 365/185.2 |
| 8,687,428 B2 | * | 4/2014 | He et al. | ..................... 365/185.2 |
| 2008/0137433 A1 | | 6/2008 | Kim et al. | |
| 2009/0029464 A1 | | 1/2009 | Xu et al. | |
| 2011/0267893 A1 | | 11/2011 | Kato et al. | |
| 2013/0107621 A1 | | 5/2013 | He et al. | |

* cited by examiner

*Primary Examiner* — Son Mai

(57) ABSTRACT

A sense amplifier is configured to sense a current from a selected bit cell of a non-volatile memory array and compare the sensed current to a reference current to determine a logic state stored in the bit cell. A controller is configured to perform a program/erase operation on at least a portion of the memory array to change a logic state of at least one bit cell of the portion of the memory array; determine a number of program/erase pulses applied to the at least one bit cell during the program/erase operation to achieve the change in logic state; and when the number of program/erase pulses exceeds a pulse count threshold, adjust the reference current of the sense amplifier for a subsequent program/erase operation.

17 Claims, 3 Drawing Sheets

NON-VOLATILE MEMORY (NVM) WITH DYNAMICALLY ADJUSTED REFERENCE CURRENT

BACKGROUND

1. Field

This disclosure relates generally to non-volatile memories (NVMs), and more specifically, to programming and erasing NVM cells.

2. Related Art

Non-volatile memories (NVMs) typically require operations for programming and erasing in NVM applications. Further these operations tend to alter the electrical operating characteristics of the NVM cells. The lifetime of an NVM is partially based on the number of these cycles that are performed. The change in operating characteristics is gradual but continuous depending on the number of cycles and operating temperature. The programmed and erased states become more difficult to achieve after excessive programming and erase cycles. The lifetime of the NVM is affected by the number of program/erase cycles. Much activity has been involved in attempting to improve on this situation.

Accordingly there is a need to provide program/erase operations with reduced detrimental effects on lifetime of an NVM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A non-volatile memory (NVM) has circuitry that provides for altering a reference current used in determining if a program state has been achieved and a reference current used in determining if an erase state has been achieved. These two reference currents can be the same. An NVM array is typically partitioned into a number of blocks where an NVM block is the minimum unit for erase operation. The reference current may be adjusted for each NVM block since different NVM blocks may have different cycling performance and data retention requirement. The number of pulses required for the particular program/erase operation in term of each block is counted. If the count is excessive for a particular block, an adjustment to the reference current supplied to that block by a current reference, which is part of a sense amplifier, is made. The adjustment takes into account the temperature, while reference currents for other blocks will be kept unchanged. The adjustment is small enough to retain a useful read margin while retaining a benefit of reducing the number or program/erase pulses which extends the lifetime. This feature can also be used selectively where it is most beneficial such as NVM that is for data storage which tends to have much more program/erase cycles than NVM that is used for code storage which has less program/erase cycles. Data retention is more important for NVM for code storage whereas cycling performance, which is where the use of this described technique would be of particular use, would be more important for NVM for data storage. This is better understood by reference to the drawings and the following written description.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
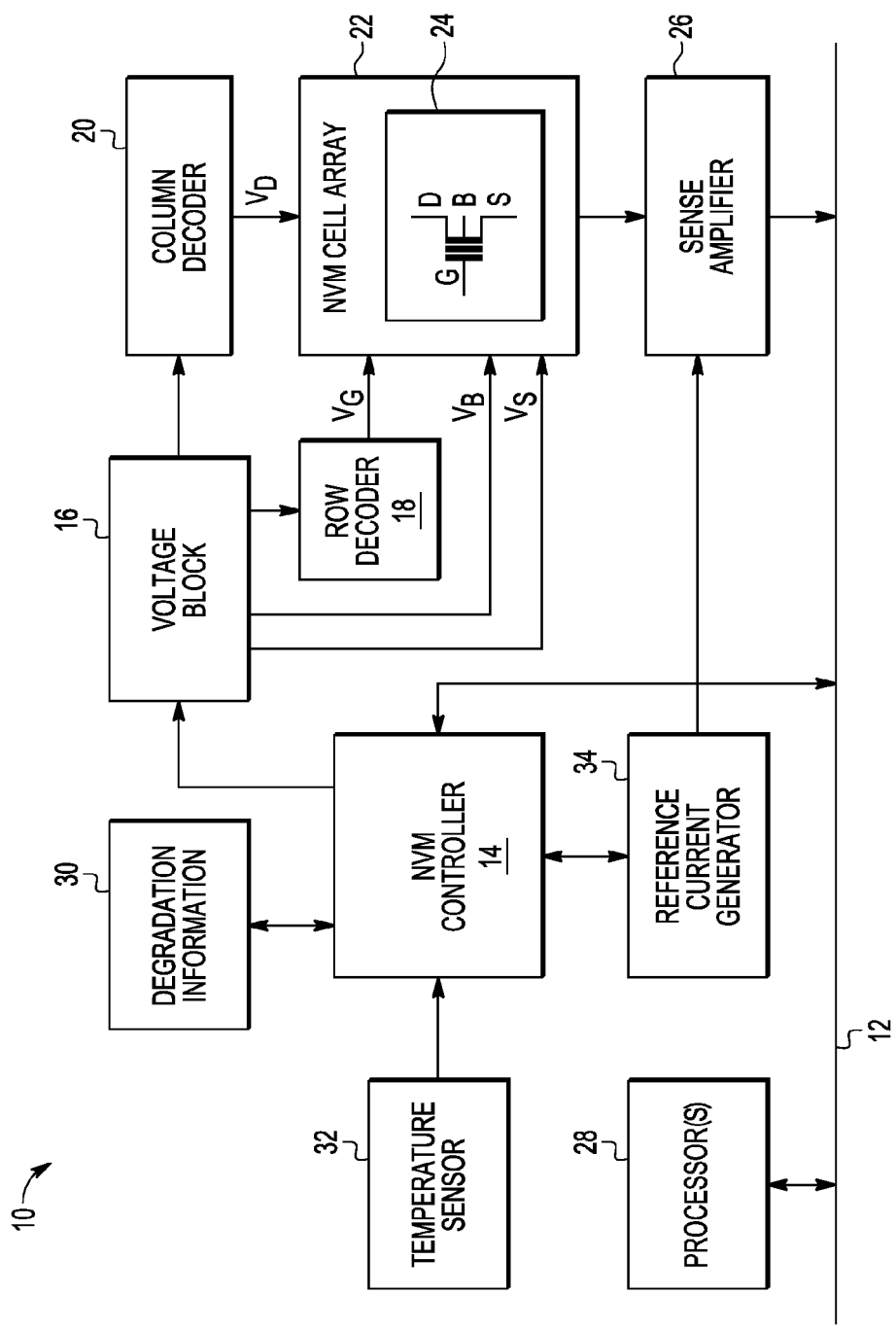
FIG. 1 is a block diagram of a system including a non-volatile memory (NVM)

Shown in FIG. 1 is a system 10 having a bus 12, an NVM controller 14 coupled to bus 12, a voltage block 16 coupled to NVM controller 14 that has charge pumps that provide bias voltages and regulated voltages, a row decoder 18 coupled to voltage block 16, a column decoder 20 coupled to voltage block 16, an NVM cell array 22 that includes many NVM cells including NVM cell 24, a sense amplifier 26 coupled to bus 12, a processor block 28 coupled to bus 12, an information block 30 having degradation information and coupled to NVM controller 14, a temperature sensor 32 coupled to NVM controller 14, and a reference current generator 34 coupled to sense amplifier 26 and NVM controller 14. Voltage block 16 is coupled to NVM cell array 22, row decoder 18, and column decoder 20. NVM cell 24 has a gate G, a source S, a drain D, and a body B. Row decoder 18 provides the voltage VG for the gates G of the NVM cells of NVM cell array 22. Similarly column decoder 20 provides the voltage VD for the drains D and voltage block 16 provides the voltages VS and VB for the sources S and bodies B, respectively. The NVM itself is made up of system 10 as shown in FIG. 1 except not including processor block 28 and bus 12.

In operation, a read is performed by NVM controller 14 directing accessing to NVM cells of NVM cell array 22 through voltage block 16, row decoder 18, and column decoder 20 and sensing the accessed NVM cells via sense amplifier 26 by comparing the accessed cell current at a read gate voltage against a read reference current. In this embodiment, when cell current is higher than the reference current, the cell is read as erased (logic high), and when cell current is lower than the reference current, the cell is read as programmed (logic low). NVM controller 14 provides read reference current to sense amplifier 26 through reference current generator 34 and voltage block 16 while receiving inputs from temperature sensor 32 and information block 30 and as well as system information from processor block 28 through bus 12.

Figure 2:
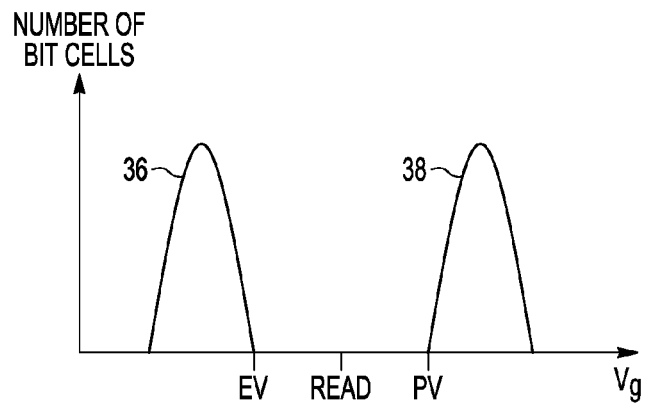
FIG. 2 is a graph of results from a program operation and an erase operation on the NVM of FIG. 1.

For an erase operation, all of the NVM cells are brought to a threshold voltage that is below some desired erase verify level. This is measured by sense amplifier 26 as determined by comparing the cell current at the erase verify gate voltage against an erase verify reference current. Programming similarly is to bring selected NVM cells to a threshold voltage that is above a desired program verify level. This is similarly measured by sense amplifier 26 as determined by a reference current and gate voltage for program verify. For a read operation, a reference current places sensing at a read voltage which is about midway between the desired erase and program verify gate levels. The reference current can be the same for erase verify, program verify, and read operations with the gate voltage being different for each of these operations This is shown in FIG. 2 which shows a threshold voltage distribution 36 with erased cells being detectable as being erased with a gate voltage at or below an erase verify voltage EV and threshold voltage distribution 38 with programmed cells being detectable as being programmed at or above a program verify voltage PV. The read voltage, which is the voltage applied at the gate of an NVM cell, is shown as about halfway between program verify voltage PV and erase verify voltage EV.

Figure 3:
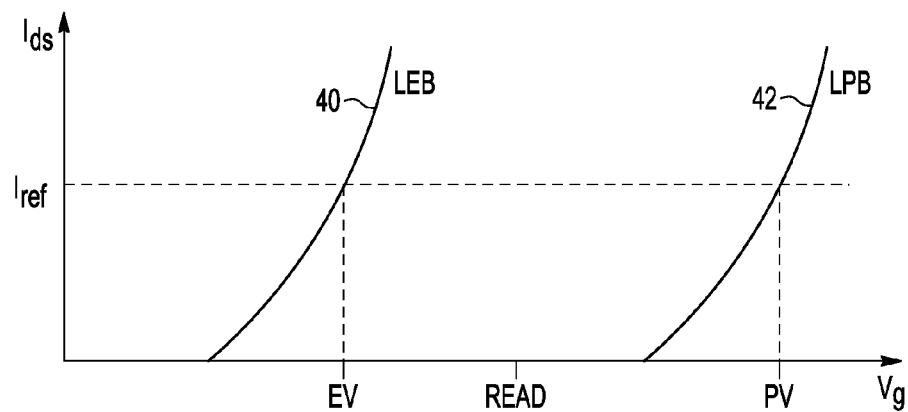
FIG. 3 is a graph of results of program verify and erase verify for the case of using the same reference current in the program and erase operations.

Shown in FIG. 3 is a plot 40 and a plot 42 of bit cell drain current versus gate voltage. Plot 40 is for a least-erased bit (LEB) cell in an NVM cell array whose drain current is about the same as but slightly more than a reference current Iref when its gate voltage is at erase verify voltage EV. Plot 42 is for a least-programmed bit (LPB) cell in an NVM cell array whose drain current is about the same as but slightly less than reference current Iref when its gate voltage is at the program verify voltage PV. In this example, reference current Iref begins at the same level for erase verify, program verify, and read operations.

Figure 4:
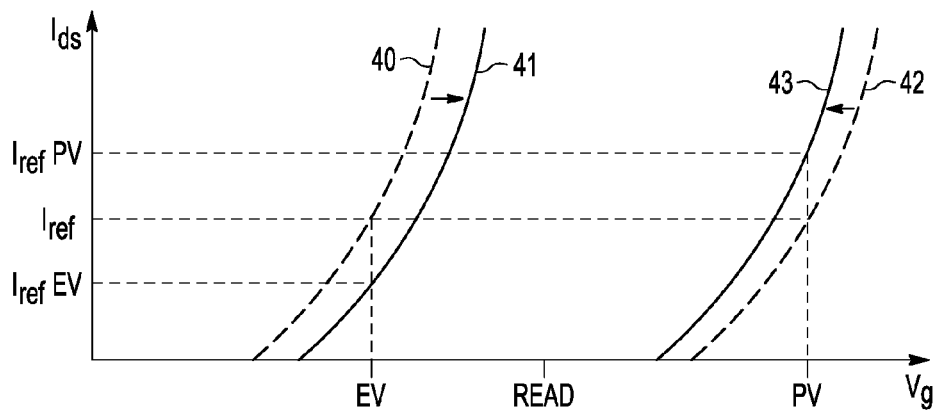
FIG. 4 is a graph of results from an adjustment in the program and erase operations.

Shown in FIG. 4, in addition to plots 40 and 42, are plots 41 and 43. Over many program/erase cycles, the number of erase and program pulses to achieve this result for a given erase or program operation can become excessive. If the number of erase pulses for an erase operation exceeds a certain limit, eventually the plot of drain current versus gate voltage, shown as plot 41 for a least erased bit, will move toward the right, which is toward the read voltage. Similarly for the program operation, if the number of program pulses exceeds a certain limit, the plot of drain current versus gate voltage, shown as plot 43 for a least programmed bit, will move to the left, toward the read voltage. In order to compensate for this, an erase verify reference current IrefEV, which is lower than the original reference current Iref, is provided for erase verify operations. This shows that with the new plot 41, the drain current is substantially equal but slightly more than erase verify reference current IrefEV. Similarly, a program verify reference current IrefPV, which is higher than the original reference current Iref, is provided for program verify operations. This shows that with the new plot 43, the drain current is substantially equal but slightly less than program verify reference current IrefPV The program verify reference current is increased current to make cells easier to pass program verify and hence compensate the degradation of programming performance over cycling. On the other hand, we decrease erase verify reference current to make cells easier to pass erase verify and hence compensate the degradation of erase performance over cycling.

This results in a small reduction in the margin between the desired program verify voltage and the normal read voltage and in the margin between the desired erase verify voltage and the read voltage. Although the reduction in margin is not generally considered desirable for data retention, a small reduction will not cause degradation in reliable sensing while reducing the time required for programming and erasing and reducing the number of the program/erase pulses required in subsequent cycles. Programming and erasing time can become a severe problem, and the large number of program/erase pulses in the program/erase cycles can greatly shorten the lifetime of the NVM. Thus, it is beneficial to compensate the program/erase performance degradation over cycling at the cost of a small reduction of data retention margin, especially on NVM that is used for data storage.

A further aspect of the operation is that temperature plays a role in how many pulses are required to achieve the desired program and erase states. For example, a lower temperature requires fewer program pulses and a higher temperature requires more program pulses while a lower temperature requires more erase pulses and a higher temperature requires fewer erase pulses. Thus, to detect certain degree of degradation, the temperature must be taken into account. Thus the number program pulses considered to be excessive is higher if the temperature is higher and lower if the temperature is lower and vice versa for the number of erase pulses.

Figure 5:
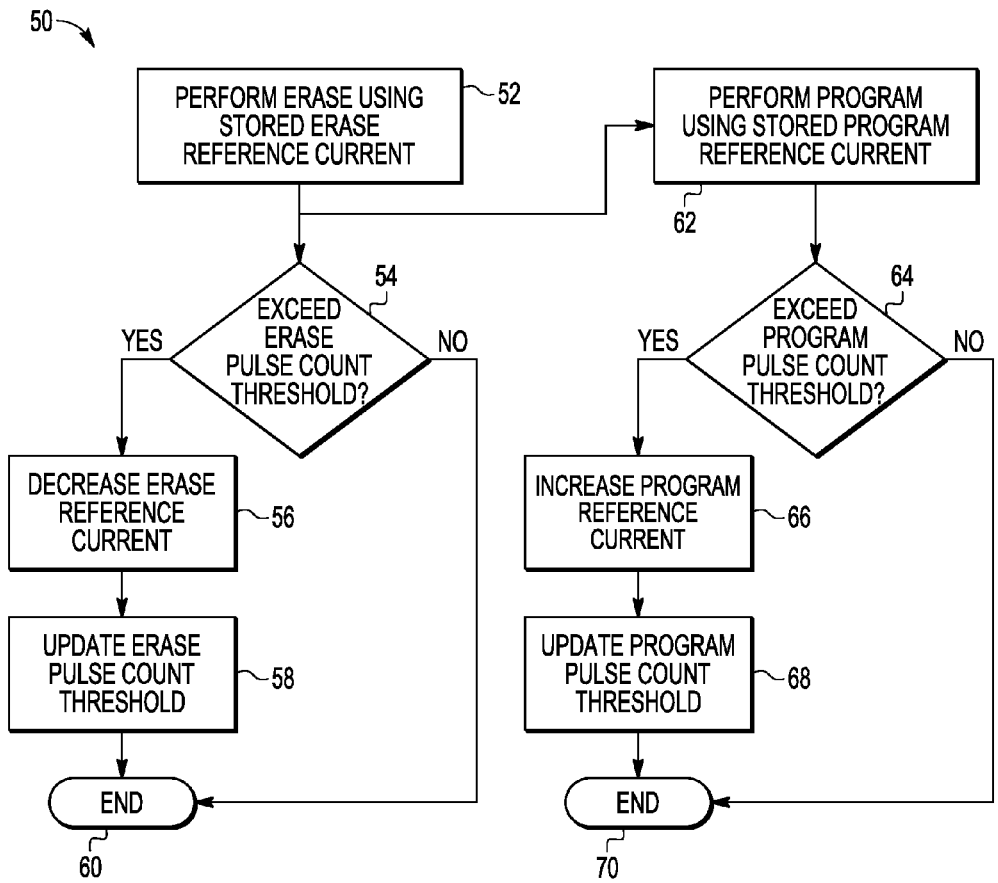
FIG. 5 is a flow chart of the program and erase operations which may be used to achieve the results depicted in the graph of FIG. 4.

Shown in FIG. 5 is a flow chart 50 depicting steps for adjusting the program and erase verify reference current in order to improve program and erase performance. At a step 52 an erase operation is performed using a stored erase reference current. Step 52 includes a applying a plurality of erase pulses until all of the NVM cells meet the level of erase established by the stored erase reference current. This information is stored in information block 30. After step 52, a program step 62 may commence. Following step 52, at a step 54 a determination is made as to whether the number of erase pulses required to achieve the erasing exceeded a predetermined number that was considered excessive. This number that is considered excessive is dependent on the number of program/erase cycles and temperature. If no, the erase step can be considered ended at a step 60, and the erase verify reference current remains unchanged. If yes, the erase reference current is decreased and stored and becomes the stored erase verify reference current for the next erase operation. At a step 58, the erase pulse count threshold is updated. The erase pulse count threshold can vary based on the particular erase reference current now being stored. After step 58, the erase operation is considered ended at step 60. At a step 62, a program operation is performed using the stored program verify reference current. This requires a plurality of program pulses for all of the NVM cells selected for programming to reach the level of programming established by the stored program verify reference current. After step 62, at a step 64 a determination is made as to whether the number of program pulses required to achieve the programming exceeded a predetermined number that was considered excessive. This number considered excessive is dependent on temperature. If no, the program step can be considered ended at a step 70. The program verify reference current remains unchanged. If yes, the program verify reference current is increased and stored and becomes the stored program verify reference current for the next program operation. At a step 68, the program pulse count threshold is updated. The program pulse count threshold can vary based on the particular program verify reference current now being stored. After step 68, the program operation is considered ended at step 70.

Figure 6:
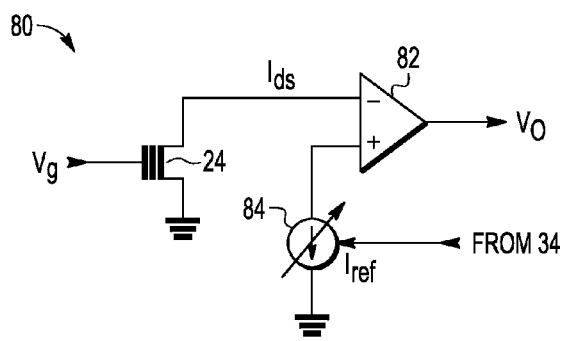
FIG. 6 is a simplified circuit diagram of a portion of the NVM of FIG. 1 useful in achieving the results shown in FIG. 4.

Shown in FIG. 6 is a simplified sense amplifier 80 as a portion of sense amplifier 26 of FIG. 1 and NVM cell 24 of NVM cell array 22. Sense amplifier 80 has a current sensing amplifier 82 and variable reference current source 84. NVM cell 24 has a gate connected to a gate voltage Vg, a drain connected to an inverting input of current sensing amplifier 82, and a source connected to ground. NVM cell 24 also has a body, not shown in FIG. 6, connected to ground. Variable reference current source 84 has a first current terminal connected to a non-inverting input of current sensing amplifier 82, a second current terminal connected to ground, and a control trim current input that receive a reference signal from reference current generator 34. Sense amplifier 80 is used for reading, program verify, and erase verify, of the particular NVM cell that is coupled to it, NVM cell 24 in the example of FIG. 6. If NVM cell 24 is being erased from a programmed state, it draws very little current with the first erase pulse, when the gate voltage is set to EV, and successively draws more current after each erase pulse during erase verify. In such case the magnitude of current being drawn in the beginning by NVM cell 24 is less than that being drawn by variable reference current source 84 which is controlled by the erase verify reference current for the erase verify operation. At the beginning then, output signal Vo provided by an output of current sensing amplifier 82 is at a logic high which is indicative of the programmed state of NVM cell 24. When the current being drawn by NVM cell 24 exceeds the current being drawn by variable reference current source 84, then output signal Vo switches to a logic low which is indicative of the erased state of NVM cell 24. The lower the current being drawn by variable reference current source 84, the less current NVM cell 24 must draw in order to cause output signal Vo to switch from a logic high to a logic low which is indicative of the NVM cell 24 transitioning from programmed state to erased state. Thus, the more relaxed erase verify current IrefEV is implemented by reducing the current drawn by variable reference current source 84. The reduced current is achieved by a signal provided by reference current generator 34 in order to achieve the decrease in erase verify reference current as described for step 56 of FIG. 5. A similar operation is provided in changing the program verify reference current when programming NVM cells from the erased state, but instead the current drawn by variable current source 66 is increased to program verify current IrefPV and the gate voltage of the particular cell during programming verify is set to PV.

System 10 is shown with one NVM but others may be present and may be operating in a very different capacity. One NVM may be more for data storage and another may be more for code storage. In which case, it may be useful to have different erase verify and program verify reference currents between those types of memories. Another NVM may contain multiple blocks of NVM cells where some NVM blocks are for data storage and some NVM blocks are for code storage. In which case, it may be useful to have different erase verify and program verify reference currents for each of the NVM block. This could easily be achieved using a sense amplifier such as sense amplifier 80 and using a reference current generator such as reference current generator 34. Further, temperature can easily be taken into account.

By now it should be appreciated that there has been provided a memory system having a non-volatile memory array comprising a plurality of bit cells. The memory system includes a sense amplifier coupled to the non-volatile memory array and configured to sense a current from a selected bit cell of the non-volatile memory array and compare the sensed current to a reference current to determine a logic state stored in the selected bit cell. The memory system further includes a controller coupled to the non-volatile memory array and sense amplifier and configured to perform a program/erase operation on at least a portion of the memory array to change a logic state of at least one bit cell of the portion of the non-volatile memory array, determine a number of program/erase pulses applied to the at least one bit cell during the program/erase operation to achieve the change in logic state, and when the number of program/erase pulses exceeds a pulse count threshold, adjust the reference current of the sense amplifier for a subsequent program/erase operation. The memory system may have a further characterization by which the pulse count threshold corresponds to a predetermined temperature range. The memory system may further include storage circuitry configured to store a plurality pulse count thresholds corresponding to the at least a portion of the non-volatile memory array, wherein each of the plurality of pulse count threshold corresponds to a unique temperature range. The memory system may have a further characterization by which the at least a portion of the non-volatile memory array corresponds to a memory block of the memory array, wherein all memory cells of the memory block are erased during an erase operation. The memory system may have a further characterization by which the sense amplifier is configured to use a previously stored reference current as the reference current during a program/erase verify performed during the program/erase operation and the adjusted reference current as the reference current during a program/erase verify performed during the subsequent program/erase operation. The memory system may have a further characterization by which the sense amplifier is further configured to perform a program/erase verify operation after each program/erase pulse during the program/erase operation. The memory system may have a further characterization by which the program/erase operation is further characterized as an erase operation, the number of program/erase pulses is further characterized as a number of erase pulses, and wherein adjusting the reference current of the sense amplifier for the subsequent program/erase operation is further characterized as decreasing the reference current of the sense amplifier. The memory system may have a further characterization by which the program/erase operation is further characterized as a program operation, the number of program/erase pulses is further characterized as a number of program pulses, and wherein adjusting the reference current of the sense amplifier for the subsequent program/erase operation is further characterized as increasing the reference current. The memory system may have a further characterization by which the controller is further configured to adjust the pulse count threshold when the reference current of the sense amplifier is adjusted for the subsequent program/erase operation.

Also disclosed is, in a non-volatile memory system, a method including performing a program/erase operation by applying program/erase pulses to a memory cell until the memory cell achieves a target logic state, wherein after each program/erase pulse, a verify is performed to determine whether the target logic state has been achieved, wherein performing the verify includes providing a verify reference current to a sense amplifier for comparison with a sensed current from the memory cell at a verify gate voltage to determine whether the target logic state has been achieved. The method further includes comparing a number of program/erase pulses applied to the memory cell to achieve the target logic state to a threshold value. The method further includes, when the number of program/erase pulses exceeds the threshold value, adjusting the verify reference current. The method further includes performing a subsequent program/erase operation to achieve the target logic state, wherein verification during the subsequent program/erase operation includes providing the adjusted verify reference current to the sense amplifier for comparison with the sensed current from the memory cell at the verify gate voltage. The method may have a further characterization by which adjusting the verify reference current comprises decreasing the verify reference current when the program/erase operation is an erase operation. The method may have a further characterization by which adjusting the verify reference current comprises increasing the verify reference current when the program/erase operation is a program operation. The method may further include sensing a temperature of the non-volatile memory system and obtaining the threshold value from storage circuitry based on the sensed temperature, wherein the threshold value corresponds to a predetermined temperature range which includes the sensed temperature. The method may have a further characterization by which the threshold value is one of a plurality of threshold values stored in the storage circuitry, in which each threshold value corresponds to a unique temperature range. The method may have a further characterization by which obtaining the threshold value from the storage circuitry is further based on an address range which includes the memory cell. The method may further include, when the verify reference current is adjusted, adjusting the threshold value.

Disclosed also is a memory system having a non-volatile memory array comprising a plurality of bit cells. The memory system includes a controller coupled to the non-volatile memory array. The controller is configured to determine whether at least one of programming performance or erasing performance of the non-volatile memory array has degraded beyond a corresponding degradation threshold. The controller is further configured to, when the at least one of the programming performance or erasing performance of the non-volatile memory array has degraded beyond the corresponding degradation threshold, adjusting a verify reference current that is provided to a sense amplifier during a program verification or an erase verification. The system may have a further characterization by which the controller is configured to determine a number of erase pulses required to erase a first bit cell of the plurality of bit cells and determine a number of program pulses required to program a second bit cell of the plurality of bit cells, wherein the controller is configured to determine whether at least one of the programming or erasing performance has degraded beyond the corresponding degradation threshold based on at least one of the number of erase pulses or the number of program pulses. The system may have a further characterization by which the controller is configured to increase a verify reference current that is provided to a sense amplifier coupled to the second bit cell for program verification during a subsequent programming of the second bit cell when the programming performance has degraded beyond the corresponding degradation threshold. The system may have a further characterization by which the controller is configured to decrease a verify reference current that is provided to a sense amplifier coupled to the first bit cell for erase verification during a subsequent erasing of the first bit cell when the erasing performance has degraded beyond the corresponding degradation threshold.

Although the invention is described herein with reference to specific embodiments, various modifications and changes can be made without departing from the scope of the present invention as set forth in the claims below. For example, a floating gate NVM was depicted but other NVM types may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system, comprising:
    a non-volatile memory array comprising a plurality of bit cells;
    a sense amplifier coupled to the non-volatile memory array and configured to sense a current from a selected bit cell of the non-volatile memory array and compare the sensed current to a reference current to determine a logic state stored in the selected bit cell; and
    a controller coupled to the non-volatile memory array and sense amplifier and configured to:
        perform a program or erase operation on at least a portion of the memory array to change a logic state of at least one bit cell of the portion of the non-volatile memory array;
        determine a number of program or erase pulses applied to the at least one bit cell during the program or erase operation to achieve the change in logic state; and
    when the number of program or erase pulses exceeds a pulse count threshold, adjust the reference current of the sense amplifier for a subsequent program or erase operation,
        wherein the pulse count threshold corresponds to a predetermined temperature range.

2. The memory system of claim 1, further comprising storage circuitry configured to store a plurality pulse count thresholds corresponding to the at least a portion of the non-volatile memory array, wherein each of the plurality of pulse count threshold corresponds to a unique temperature range.

3. The memory system of claim 1, wherein the at least a portion of the non-volatile memory array corresponds to a memory block of the memory array, wherein all memory cells of the memory block are erased during an erase operation.

4. The memory system of claim 1, wherein the sense amplifier is configured to use a previously stored reference current as the reference current during a program or erase verify performed during the program or erase operation and the adjusted reference current as the reference current during a program or erase verify performed during the subsequent program or erase operation.

5. The memory system of claim 1, wherein the sense amplifier is further configured to perform a program or erase verify operation after each program or erase pulse during the program or erase operation.

6. The memory system of claim 1, wherein the program or erase operation is further characterized as an erase operation, the number of program or erase pulses is further characterized as a number of erase pulses, and wherein adjusting the reference current of the sense amplifier for the subsequent program or erase operation is further characterized as decreasing the reference current of the sense amplifier.

7. The memory system of claim 1, wherein the program or erase operation is further characterized as a program operation, the number of program or erase pulses is further characterized as a number of program pulses, and wherein adjusting the reference current of the sense amplifier for the subsequent program or erase operation is further characterized as increasing the reference current.

8. The memory system of claim 1, wherein the controller is further configured to adjust the pulse count threshold when the reference current of the sense amplifier is adjusted for the subsequent program or erase operation.

9. In a non-volatile memory system, a method comprising:
performing a program or erase operation by applying program or erase pulses to a memory cell until the memory cell achieves a target logic state, wherein after each program or erase pulse, a verify is performed to determine whether the target logic state has been achieved, wherein performing the verify includes providing a verify reference current to a sense amplifier for comparison with a sensed current from the memory cell at a verify gate voltage to determine whether the target logic state has been achieved;
comparing a number of program or erase pulses applied to the memory cell to achieve the target logic state to a threshold value;
when the number of program or erase pulses exceeds the threshold value, adjusting the verify reference current;
performing a subsequent program or erase operation to achieve the target logic state, wherein verification during the subsequent program or erase operation includes providing the adjusted verify reference current to the sense amplifier for comparison with the sensed current from the memory cell at the verify gate voltage;
sensing a temperature of the non-volatile memory system; and
obtaining the threshold value from storage circuitry based on the sensed temperature, wherein the threshold value corresponds to a predetermined temperature range which includes the sensed temperature.

10. The method of claim 9, wherein adjusting the verify reference current comprises decreasing the verify reference current when the program or erase operation is an erase operation.

11. The method of claim 9, wherein adjusting the verify reference current comprises increasing the verify reference current when the program or erase operation is a program operation.

12. The method of claim 9, wherein the threshold value is one of a plurality of threshold values stored in the storage circuitry, in which each threshold value corresponds to a unique temperature range.

13. The method of claim 9, wherein obtaining the threshold value from the storage circuitry is further based on an address range which includes the memory cell.

14. The method of claim 9, further comprising:
when the verify reference current is adjusted, adjusting the threshold value.

15. A memory system, comprising:
a non-volatile memory array comprising a plurality of bit cells; and
a controller coupled to the non-volatile memory array and configured to:
determine whether at least one of programming performance or erasing performance of the non-volatile memory array has degraded beyond a corresponding degradation threshold; and
when the at least one of the programming performance or erasing performance of the non-volatile memory array has degraded beyond the corresponding degradation threshold, adjusting a verify reference current that is provided to a sense amplifier during a program verification or an erase verification, wherein the controller is configured to determine a number of erase pulses required to erase a first bit cell of the plurality of bit cells and determine a number of program pulses required to program a second bit cell of the plurality of bit cells, wherein the controller is configured to determine whether at least one of the programming or erasing performance has degraded beyond the corresponding degradation threshold based on at least one of the number of erase pulses or the number of program pulses.

16. The memory system of claim 15, wherein the controller is configured to increase a verify reference current that is provided to a sense amplifier coupled to the second bit cell for program verification during a subsequent programming of the second bit cell when the programming performance has degraded beyond the corresponding degradation threshold.

17. The memory system of claim 15, wherein the controller is configured to decrease a verify reference current that is provided to a sense amplifier coupled to the first bit cell for erase verification during a subsequent erasing of the first bit cell when the erasing performance has degraded beyond the corresponding degradation threshold.

* * * * *